United States Patent
Ishii et al.

(10) Patent No.: US 6,680,152 B2
(45) Date of Patent: Jan. 20, 2004

(54) PHOTOSENSITIVE RESIN COMPOSITION

(75) Inventors: Kenji Ishii, Tokyo (JP); Nobuyuki Ikeguchi, Tokyo (JP); Takabumi Omori, Tokyo (JP); Daisuke Ohno, Tokyo (JP)

(73) Assignee: Mitsubishi Gas Chemical Company, Inc., Tokyo (JP)

( * ) Notice: Subject to any disclaimer, the term of this patent is extended or adjusted under 35 U.S.C. 154(b) by 0 days.

(21) Appl. No.: 10/158,159

(22) Filed: May 31, 2002

(65) Prior Publication Data
US 2003/0017414 A1 Jan. 23, 2003

(30) Foreign Application Priority Data

May 31, 2001 (JP) ........................................ 2001/164645
May 31, 2001 (JP) ........................................ 2001/164651

(51) Int. Cl.$^7$ .......................... G03F 7/027; C07C 69/54
(52) U.S. Cl. ................... 430/18; 430/284.1; 430/280.1; 430/138; 522/92; 528/363; 528/271; 528/361
(58) Field of Search .................. 430/284.1, 280.1, 430/138, 18; 522/92; 528/363, 271, 361

(56) References Cited

U.S. PATENT DOCUMENTS

| 4,533,727 | A | * | 8/1985 | Gaku et al. ................. 528/271 |
| 4,726,877 | A | * | 2/1988 | Fryd et al. ................. 430/281.1 |
| 6,218,074 | B1 | * | 4/2001 | Dueber et al. ............ 430/284.1 |
| 6,528,552 | B1 | * | 3/2003 | Ikeguchi et al. .............. 522/81 |

FOREIGN PATENT DOCUMENTS

| EP | 1035440 A1 | * | 9/2000 | ........... G03F/7/038 |
| EP | 1076262 A1 | * | 2/2001 | ........... G03F/7/038 |

* cited by examiner

*Primary Examiner*—Cynthia Hamilton
(74) *Attorney, Agent, or Firm*—Wenderoth, Lind & Ponack, LLP

(57) ABSTRACT

A photosensitive resin composition (C) containing a photosensitive resin (B) which is a reaction product produced by modifying an epoxy acrylate (a) with a cyanate ester compound (b) to obtain a modification product (A) and reacting the modification product (A) with a polybasic acid anhydride (c), and a compound (d) of the formula,

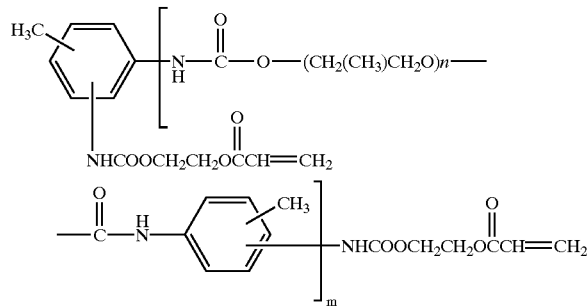

in which each of n and m is an integer of at least 1, and a cured product of the photosensitive resin composition (C).

12 Claims, No Drawings

US 6,680,152 B2

PHOTOSENSITIVE RESIN COMPOSITION

FIELD OF THE INVENTION

The present invention relates to a photosensitive resin composition for use as a material for printed wiring boards. More specifically, it relates to a photosensitive resin composition which is excellent in flexibility and elongation and is also excellent in heat durability and electric characteristics and which is suitable for use as a material for printed wiring boards.

and excellent elongation and having high heat durability and excellent electric insulation, and a cured product thereof.

According to the present invention, there is provided a photosensitive resin composition (C) containing a photosensitive resin (B) which is a reaction product produced by modifying an epoxy acrylate (a) with a cyanate ester compound (b) to obtain a modification product (A) and reacting the modification product (A) with a polybasic acid anhydride (c), and a compound (d) of the formula,

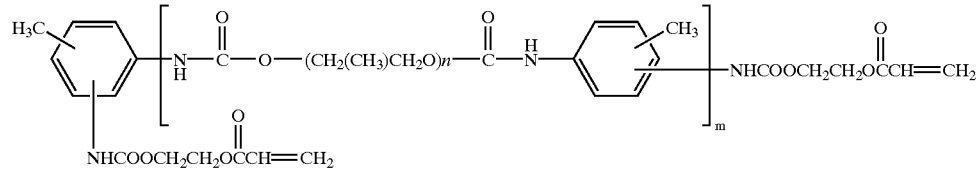

BACKGROUND OF THE INVENTION

In recent years, it is desired to downsize and compact electronic machines and equipment, and it is therefore as well essential to comply with downsizing, a higher fineness and a decrease in weight and thickness with regard to printed wiring boards. A solder resist material to be applied onto a substrate has been generally selected from those materials which are ultraviolet-curable and developable with a diluted alkali and which is excellent in durability against soldering and solvents. However, "build-up" substrates having fine wirings inside recently come to encounter problems in the crack resistance of a cured product of a photosensitive resin since microcracks occur in a solder resist/sealing resin interface in the "build-up" substrates due to a difference between thermal expansion coefficients. Further, it is also demanded to improve a solder resist in insulation reliability between lines of a closely packed wiring.

For improving electric insulation and heat resistance, there has been developed a resin, such as a bismaleimide-triazine resin (BT resin), produced by reacting a cyanate ester compound with an epoxy acrylate. The above resin is improved in both electric characteristics and developability at the same time. However, although the above resin is excellent in electric insulation and heat resistance, it is poor in flexibility and elongation since it has a high elastic modulus due to a hard cyanate ester structure.

Most of conventional methods as a means for improving flexibility and elongation utilize a method in which an elastic modulus as a whole is decreased by incorporating a resin having a low elastic modulus or a method in which a resin having a low elastic modulus is incorporated into a molecule of an unsaturated-group-containing polycarboxylic acid resin by a reaction to achieve a low elastic modulus. Resists obtained according to the above methods have excellent flexibility but have problems of low heat durability and poor electric insulation. There have been developed no resist compositions excellent in flexibility and elongation and also excellent in heat durability and electric insulation.

SUMMARY OF THE INVENTION

It is an object of the present invention to provide a photosensitive resin composition having excellent flexibility in which each of n and m is an integer of at least 1.

According to the present invention, further, there is provided a photosensitive resin composition (C) according to the above, which further contains a multistructured (core/shell type) powder (e) having rubber elasticity in a core.

According to the present invention, further, there is provided a cured product of the photosensitive resin composition (C) recited above.

DETAILED DESCRIPTION OF THE INVENTION

The present inventors have made diligent studies to accomplish the above object and as a result have found the following. An epoxy acrylate modified with a cyanate ester compound and a polybasic acid anhydride is used as a main resin for a resist. A compound (d) of the above formula as an essential component is incorporated into a photosensitive resin composition (C), and optionally a multistructured powder (e) having rubber elasticity in a core is further incorporated as an essential component into the photosensitive resin composition (C). In this case, it is possible to impart flexibility to the photosensitive resin composition (C) without impairing other characteristic properties, and there can be obtained a photosensitive resin composition excellent in crack resistance and also excellent in heat durability and electric insulation. On the basis of the above finding, the present invention has been completed.

The epoxy acrylate (a) used in the present invention refers to a reaction product between an epoxy resin and an acrylic acid. Examples of the epoxy acrylate (a) include bisphenol A type epoxy acrylate, bisphenol Z type epoxy acrylate, bisphenol F type epoxy acrylate, biphenol-epoxy acrylate, tetramethylbiphenol-epoxy acrylate, hexamethylbiphenol-epoxy acrylate, xylenenovolak-epoxy acrylate, dicyclopentadienenovolak-epoxy acrylate, phenolnovolak-epoxy acrylate and cresolnovolak-epoxy acrylate. There maybe used a composition and a reaction product containing one compound or at least two compounds of these as required. Of these, easily commercially available bisphenol A type epoxy acrylate is suitable.

The cyanate ester compound (b) used in the present invention is represented by the following formula, $$R-(O-CN)_m$$

in which m is generally an integer of from at least 2 to 5 or less, R is an aromatic organic group, and the cyanate group directly bonds an aromatic ring of the above organic group R.

Specific examples of the cyanate ester compound (b) include 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4'-dicyanatobiphenyl, bis(4-cyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate and cyanates obtained by a reaction between novolak and cyan halide.

In addition, there maybe used polyfunctional cyanate ester compounds disclosed in Japanese Patent Publications Nos. 41-1928, 43-18468, 44-4791, 45-11712, 46-1112 and 47-26853 and JP-A-51-63149. These cyanate ester compounds may be used alone or in combination. These components have a remarkably low content level of impurities such as hydrolysable Cl and Na. These components serve to decrease the content of impurities as a whole when incorporated as one component in the present invention, so that the photosensitive resin composition of the present invention is an optimum photosensitive resin composition as a peripheral material for semiconductors.

Further, there may be used a prepolymer having a molecular weight of 200 to 6,000 and having a triazine ring formed by trimerizing cyanato groups of any one of these polyfunctional cyanate ester compounds. The above prepolymer can be obtained by polymerizing the above polyfunctional cyanate ester monomer in the presence of a catalyst selected from acids such as mineral acid and Lewis acid, bases such as sodium alcoholate and tertiary amines, or salts such as sodium carbonate. The prepolymer partially contains unreacted monomer and has the form of a mixture of a monomer and a prepolymer, and the prepolymer in the above form is also suitably used in the present invention.

The polybasic acid anhydride (c) used in the present invention refers to an anhydride having at least two carboxylic acids per molecule. Examples of the polybasic acid anhydride (c) include phthalic acid anhydride, trimellitic acid anhydride, pyromellitic acid anhydride, naphthalene-1,4,5,8-tetracarboxylic acid dianhydride, benzophenone tetracarboxylic acid anhydride, tetrahydropthalic acid anhydride, hexahydrophthalic acid anhydride, 4-methylhexahydropthalic acid anhydride, 3-methylhexahydrophthalic acid anhydride, succinic acid anhydride, dodecenylsuccinic acid anhydride, ethylene glycolbis(anhydrotrimellitate), glecerin bis(anhydrotrimellitate), 3,3',4,4'-diphenylsulfonetetracarboxylic acid dianhydride, 4,4'-oxydiphthalic acid anhydride, 3,3',4,4'-biphenyltetracarboxylic acid dianhydride, 3,3',4,4'-benzophenontetracarboxylic acid dianhydride, cyclopentanetetracarboxylic acid dianhydride, butanetetracarboxylic acid dianhydride, malein-modified methylcyclohexenetetraprotic acid anhydride, other compound having acid anhydride in molecule, and a composition containing one compound or at least two compounds of these.

The compound (d) which is an essential component of the present invention refers to a compound having a structure of the following formula,

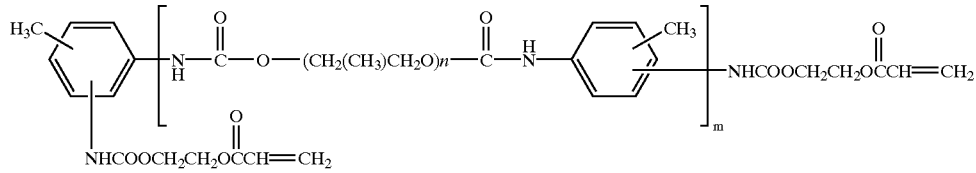

in which each of n and m is an integer of at least 1. The compound (d) can be selected from generally known compounds. Commercially available examples thereof include Actilane 120TP25, Actilane 167, Actilane 170, Actilane 180GP20, Actilane 180HD20, Actilane 180TP20 (supplied by Nihon SiberHegner K.K.). With regard to a molecular weight, the molecular weight of the compound (d) is 500 to 10,000. Particularly preferably, it is 3,000 to 7,000. The amount of the compound (d) per 100 parts by weight of the photosensitive resin (B) is 1 to 50 parts by weight. It is preferably 5 to 20 parts by weight.

The multistructured core/shell polymer powder (e) used in the present invention can be selected from generally known multistructured powders. For decreasing elastic modulus and increasing elongation, there is used a powder having a structure of at least two layers in which a core layer is formed of a rubber-like polymer having elastic modulus and the outer surface of the core layer is coated with a glassy polymer or an inorganic substance. Of course, there can be used a powder having a structure in which the central part is formed of a glassy polymer, a layer on the glassy polymer part is formed of a rubber-like polymer and the outermost layer is formed of a glassy polymer. Although not specially limited, the rubber-like polymer is preferably selected from acrylic rubber and copolymers thereof. When the shell part is formed of glassy polymer, no limitation is imposed. The glassy polymer includes an acrylonitrile-styrene polymer, an epoxy resin, a carboxyl-group-containing polymer, and a hydroxyl-group-containing polymer. When the shell part is formed of inorganic substance, there is used a powder coated with silica, alumina or the like. Commercially available examples of the multistructured powder (e)includes Staphyloid AC3355, Staphyloid AC3816, Staphyloid AC3832, Staphyloid AC4030, Staphyloid AC3364, Staphyloid IM101, Staphyloid IM203, Staphyloid IM301, Staphyloid IM401, Staphyloid IM601, Ganzpearl GBM55 and Ganzpearl GM1005H (supplied by GANZ CHEMICAL CO., LTD.).

In particular, a powder coated with a carboxyl-group-containing polymer is preferred for a UV-selective thermosetting resist. The use of the above powder gives a UV-selective thermosetting resist having excellent developability. Since the shell layer is excellent in chemical resistance, blocking is hard to occur at the time of incorporation so that a homogenous photosensitive resin composition can be obtained. Although the particle diameter of the multistructured powder (e) is not specially limited, it is preferably 0.06 to 20 μm in view of homogenous dispersion and developability. The amount of the multistructured powder (e) per 100 parts by weight of the photosensitive resin (B) is 1 to 50 parts by weight. When the amount of the multistructured powder (e) increases, developability and dispersibility decrease, which causes a decrease in mechanical properties. Therefore, the amount of the multistructured powder (e) is preferably 5 to 30 parts by weight.

The method of practicing the present invention will be explained below. First, the epoxy acrylate (a) is modified with the cyanate ester compound (b). In this modification, although not specially limited, the amount of the cyanate ester compound (b) per 100 parts by weight of the epoxy acrylate (a) is generally 5 to 40 parts by weight. When the amount of the cyanate ester compound (b) is small, a resin composition containing the resultant resin is insufficient in heat durability, humidity durability and electric insulation after a pressure cooker test. When the above amount is large, there is liable to caused a problem during the production such as a problem that gelation takes place during the resin synthesis. Therefore, it is preferably 10 to 30 parts by weight. The reaction temperature is 50 to 100° C. The reaction time is 5 to 100 hours. A solvent may be used for adjusting viscosity during the reaction. The solvent is not specially limited, while it is preferably selected from those having a boiling point in a range in which they can evaporate when a coating of the photosensitive resin composition is dried. For example, the above solvent includes ketones such as acetone and methyl ethyl ketone, esters such as propylene glycol monomethyl ether acetate, diethyl ether monomethyl ether acetate and carbitol acetate, and aromatic hydrocarbons such as solvent naphtha, toluene, xylene and ethylbeznene. These solvents may be used alone or in combination.

Then, for rendering the above-obtained resin alkali-developable, the carboxylic acid modification of the resin is carried. The amount of the polybasic acid anhydride (c) per 100 parts by weight of the epoxy acrylate (a) is 10 to 90 parts by weight. In this case, the obtained resin has an acid value in the range of from 40 to 400 mgKOH/g. However, the acid value is preferably in the range of from approximately 50 to 100 mgKOH/g in view of developability. It is therefore preferred to adjust the amount of the polybasic acid anhydride (c) so as to attain the acid value in the above range. Further, a solvent can be used for adjusting viscosity in this case, and the solvent can be selected from solvents described above.

When the photosensitive resin composition (C) containing the photosensitive resin (B) and the compound (d) is used as a resist ink, the photosensitive resin composition (C) contains, in addition to the photosensitive resin (B) and the compound (d), an epoxy resin, a photopolymerization initiator and a photopolymerizable compound containing an ethylenic unsaturated group other than the compound (d).

When the photosensitive resin composition (C) containing the photosensitive resin (B), the compound (d) and the multistructured powder (e) having rubber elasticity in a core is used as a resist ink, the components described above are similarly used.

The epoxy resin used in the present invention can be selected from generally known epoxy resins. Specific examples of the epoxy resin include a bisphenol A type epoxy resin, a bisphenol F type epoxy resin, a biphenyl type epoxy resin, a phenol novolak type epoxy resin, a cresol novolak type epoxy resin, a xylene novolak type epoxy resin, triglycidyl isocyanurate, an alicyclic epoxy resin, a dicyclopentadiene type epoxy resin, a biphenyl novolak type epoxy resin and a dicyclopentadiene novolak type epoxy resin. These epoxy resins may be used alone or in combination as required.

The photopolymerization initiator used in the present invention can be selected from known initiators. Specific examples of the photopolymerization initiator include α-diketones such as benzyl and acetyl, acyloin ethers such as benzoin ethyl ether and benzoin isopropyl ether, thioxanthones such as thioxanthone and 2,4-diethylthioxanthone, benzophenones such as benzophenone and 4,4'-bis (dimethylamino)benzophenone, acetophenones such as acetophenone, 2,2'-dimethoxy-2-phenylacetophenone and β-methoxyacetophenone, quinones such as anthraquinone and 1,4-naphthoquinone, and peroxides such as di-tert-butyl peroxide. These initiators may be used alone or in combination. The amount of the polymerization initiator is 0.1 to 20% by weight, preferably 0.2 to 10% by weight.

The photopolymerizable compound containing an ethylenic unsaturated group other than the compound (d) used in the present invention can be selected from known photopolymerization compounds. For example, it includes (meth) acrylates of a monohydric or polyhydric alcohol such as trimethylol propane tri(meth)acrylate, pentaerithritoltetra (meth)acrylate and dipentaerithritolhexa(meth)acrylate, and acrylates of epoxy such as a bisphenol A type epoxy acrylate and a bisphenol F type epoxy acrylate. These photopolymerizable compounds can be used alone or in combination. The amount of the photopolymerizable compound in the resin is 1 to 50% by weight, preferably 5 to 30% by weight.

The resin is mixed according to a generally known kneading method using a three-roll mill, a homogenizer, or the like. The photosensitive resin composition (C) may contain known additives such as a filler, a curing promoter, an antifoamer, a surface treating agent, a flame retardant, a pigment, a dye, and the like. The filler includes silicas such as natural silica, fused silica and amorphous silica, white carbon, titanium white, aerosil, alumina, talc, natural mica, synthetic mica, kaolin, clay, aluminum hydroxide, barium sulfate, E-glass, A-glass, C-glass, L-glass, D-glass, S-glass, M-glass and G-20 glass. The curing promoter includes imidazoles such as 2-methylimidazole, 2-ethyl-4-methylimidazole, 2-undecylimidazole, 2-heptadecylimidazole, 2-phenylimidazole and 1-benzyl-2-methylimidazole, tertiary amines such as benzyldimethylamine, and phosphorus compounds such as phosphine and phosphonium compounds.

When the photosensitive resin composition (C) is used as a resist ink, the content of the photosensitive resin in the photosensitive resin composition (C) is preferably 30 to 90% by weight. When the content of the photosensitive resin is less than 30% by weight, it is difficult to secure a uniform thickness of a layer formed of the composition, and the layer is destabilized in quality, so that the resist ink can not stand up to a use for a printed wiring board. When the above content exceeds 90% by weight, an applied resist ink may peel off from a printed wiring board or may vary electric properties.

The photosensitive resin composition (C) of the present invention is useful as a resist ink for an etching resist, a solder resist and a permanent resist such as an insulating resist for a "build-up" printed wiring board, and it can be also used as a coating composition, a coating agent or an adhesive. For example, the photosensitive resin composition (C) of the present invention is cured as follows, thereby obtaining a cured product. That is, the photosensitive resin composition (C) of the present invention is applied to a printed wiring board by a screen printing method, a spraying method, a roll coating method, an electrostatic method, a curtain coating method, or the like, to form a coating having a thickness of 10 to 160 $\mu$m, and the coating is dried at 60 to 110° C. Then, the coating is exposed to ultraviolet light through a negative film, and a non-exposed portion is developed with a dilute alkali aqueous solution. Further, for improving physical properties, the remaining coating is fully cured by irradiation with ultraviolet light or heating, to obtain a cured coating.

The light source for the irradiation of an active energy line for curing the photosensitive resin composition (C) of the present invention includes a low-pressure mercury lamp, an intermediate-pressure mercury lamp, a high-pressure mercury lamp, an ultrahigh-pressure mercury lamp, a xenon lamp and a metal halide lamp. The quantity of the exposure is 100 to 2,000 mJ/cm$^2$, preferably 250 to 1,000 mJ/cm$^2$. When the quantity of the exposure is small, an exposed portion is not cured and is dissolved during the development.

The development of the photosensitive resin composition (C) after the photoirradiation can be carried out by a known method such as a spraying method in which a developer solution is sprayed with a spray or a dipping method in which a printed wiring board is dipped and shook in a developer solution. The temperature of the developer solution is 5° C. to 50° C., preferably 25° C. to 40° C. When the above temperature is lower the above lower limit, the development may take a long time or there may be caused a problem that developability is poor. When the temperature of the developer solution is higher than the above upper limit, a cured portion which has been exposed to the light is dissolved. As a developer solution, there can be used a known dilute alkali aqueous solution, such as a sodium carbonate aqueous solution, a sodium hydroxide aqueous solution or an ammonium hydroxide aqueous solution. The content of the alkali chemical in the aqueous solution is properly 0.1 to 5.0% by weight.

After the development, the photosensitive resin composition (C) of the present invention is cured under heat. The curing temperature is 100° C. to 250° C., preferably 120° C. to 200° C. When the temperature is lower than the above lower limit, the curing takes a long time. When it is higher than the above upper limit, there may be caused problems of discoloration and partial swelling. After the curing under heat, the photosensitive resin composition (C) of the present invention may be plated with, for example, nickel and gold.

The photosensitive resin composition (C) of the present invention is a photosensitive resin composition containing as essential components a modified epoxy acrylate which is modified with a cyanate ester compound and then modified with a acid anhydride, and a compound having a specific structure. The photosensitive resin composition (C) of the present invention has excellent flexibility and excellent elongation and further has high heat durability and excellent electric insulation.

EXAMPLES

The present invention will be more specifically explained with reference to Examples and Comparative Examples hereinafter, while the present invention shall not be limited by Examples.

Synthetic Example 1

100 parts by weight of bisphenol A type epoxy acrylate (SP1509, supplied by SHOWA HIGHPOLYMER CO., LTD.), 5 parts by weight of a bisphenol A type cyanate ester compound (BT2070, supplied by Mitsubishi Gas Chemical Co., Inc.) and 105 parts by weight of a solvent containing carbitol acetate and naphtha (carbitol acetate/naphtha=50/50) were mixed, to prepare a mixture having a solid content of 50%. While the mixture was mechanically stirred under heat at 70° C., a cyanate peak (around 2,300 cm$^{-1}$) was monitored based on an infrared absorption spectrum. After 5.5 hours, the cyanate peak disappeared, so that the reaction was terminated. To the resultant reaction mixture were added 22.5 parts by weight (corresponding to 50% of molar amount of epoxy acrylate) of pyromellitic acid anhydride and 22.5 parts by weight of the same solvent as above. While the mixture was mechanically stirred at a reaction temperature of 70° C., a carboxylic acid anhydride peak (around 1,850 cm$^{-1}$) was monitored based on an infrared absorption spectrum. After 6 hours, the carboxylic acid anhydride peak disappeared, so that the reaction was terminated. The above-obtained resin (i) had a carboxylic value of 90.2 mgKOH/g.

Synthesis Example 2

386 parts by weight of a phenol novolak type epoxy resin (EPPN201L, supplied by Nippon Kayaku Co., Ltd., epoxy equivalent 193) and 144 parts by weight of acrylic acid were allowed to react at 120° C. in carbitol acetate. Then, to the reaction product was added 180 parts by weight of hexahydrophthalic acid anhydride, and the mixture was allowed to react at 80° C. for 5 hours. The thus-obtained resin (ii) had a carboxylic acid value of 92.3 mgKOH/g.

EXAMPLES 1 AND 2 and

COMPARATIVE EXAMPLES 1 to 4

The synthesized main resin (i) and the main resin (ii) and a compound (d) were mixed in amounts shown in Table 1. The mixture was kneaded with a three-roll mill (supplied by Aimex) to obtain a photosensitive resin composition and a solution thereof. The above solution (coating composition) was applied onto a printed wiring board of which a copper circuit surface had been treated by a MEC CZ treatment (supplied by MEC. CO., LTD.). The applied composition was dried at 80° C. for 20 minutes to remove the solvent. A film was disposed thereon. The coating was exposed to ultraviolet light at 500 mJ/cm$^2$. Then, development was carried out with a 1 wt % sodium carbonate aqueous solution. The resultant coating was cured under heat at 150° C. for 1 hour. Table 2 shows the results of evaluation of characteristic properties.

The resin composition as a coating was evaluated for characteristic properties by the following methods.

Adhesion: According to JIS K 5400, a test piece was cross-cut to obtain 100 squares having a size of 1 mm×1 mm, a peeling off test was carried out with a Cellophane tape, and the state of the squares after the peeling off test was visually evaluated. Denominator in Table 2 shows the number of squares tested. Numerator shows the number of remaining squares.

Flexibility: A coating having a thickness of 40 μm was formed on a copper plate having a thickness of 0.3 mm, and Erichsen test (JIS K 5400) was carried out.

Heat durability against soldering: A test piece was immersed in a solder bath having a temperature of 260° C. for 30 seconds, and a test piece was visually checked for the presence or absence of a failure.

A=coating had no failure.

X=coating was swelled and peeled off.

Glass transition temperature: A coating having a thickness of 40 μm was formed. Glass transition temperature was measured according to TMA method (JIS C6481).

Developability: After development, a coating was thermally cured at 150° C. for 1 hour. Then, a development surface was visually observed, and electroless nickel plating (pH 4.5, immersion at 90° C. for 20 minutes) was carried out. A nickel-plated state was visually observed to evaluate developability.

Acid resistance: A test piece was immersed in a 10% by weight hydrochloric acid for 30 minutes, and then the state of a coating was visually observed.

A=coating had no failure.

X=coating was swelled and peeled off.

Anti-migration properties: An obtained coating composition was applied to a substrate (trade name of copper-clad laminate used: CCL-HL830, supplied by Mitsubishi Gas Chemical Co., Inc., line/space=60/60 μm) having fifty comb-like patterns by a screen printing method, and the coating was dried at 80° C. with a hot-air dryer to form a coating having a thickness of 30–40 μm. Then, a negative film was brought into intimate contact with the coating. The coating was exposed to ultraviolet light at 500 mJ/cm$^2$, and then developed with a 1 wt % sodium carbonate aqueous solution. Then, the coating was thermally cured at 150° C. for 1 hour. The resultant substrate was measured for insulation resistance at 85° C. at 85% RH under 50 VDC, to obtain a migration. Table 2 shows an insulation resistance before the test and an insulation resistance after 400 hours.

Elongation, elastic modulus, maximum stress: A coating composition was applied to a copper foil, dried at 80° C. for 20 minutes and exposed to ultraviolet light at 500 mJ/cm$^2$. The above application, drying and exposure were repeated, to obtain a coating having a thickness of approximately 100 μm. Then, the copper foil was removed by etching to obtain a sample piece. A tension test (JIS K 7127) was carried out by using the sample piece, whereby elongation, elastic modulus and maximum stress were measured.

Crack resistance: Circuits were formed in a copper-clad laminate (trade name: CCL-HL830HS, 0.1 mm 18 μm double-side copper foils, supplied by Mitsubishi Gas Chemical Co., Inc.). A composition was applied to the entire surface, dried at 80° C. for 20 minutes and exposed to ultraviolet light at 500 mJ/cm$^2$, to obtain a coating having a thickness of 40 μm. Similar application, drying and UV exposure were also carried out on the opposite surface of the copper-clad board. A 400 μm thick semiconductor chip was bonded to a central circuit with a dieattach (trade name: BT-S657D, supplied by Mitsubishi Gas Chemical Co., Inc.), and a curing was carried out at 110° C. for 2 hours and then at 160° C. for 2 hours. A coating of a potting resin (trade name: BT-S657D, supplied by Mitsubishi Gas Chemical Co., Inc.) was formed thereon, and a curing was carried out at 110° C. for 2 hours and then at 160° C. for 3 hours, to obtain a test piece. The test piece was subjected to a thermal shock test. In this test, the test piece was immersed alternately in a liquid bath having a temperature of –55° C. for 5 minutes and a liquid bath having a temperature of +150° C. for 5 minutes, the above alternate immersions were considered as one cycle and 300 cycles were carried out. Then, 100 sheets were tested for resist cracks and circuit cutting of the printed wiring board. In Table 2, denominator shows the number of test pieces used for the test and numerator shows the number of cracks or circuit cuttings.

TABLE 1

|  | Examples | | Comparative Examples | | | | |
| --- | --- | --- | --- | --- | --- | --- | --- |
|  | 1 | 2 | 1 | 2 | 3 | 4 | 5 |
| Resin (i) | 100 | 100 | 100 | 100 | 100 | 0 | 0 |
| Resin (ii) | 0 | 0 | 0 | 0 | 0 | 100 | 100 |
| Compound (d-1) | 15 | 30 | 0 | 60 | 0 | 0 | 15 |
| Compound (d-2) | 0 | 0 | 0 | 0 | 15 | 0 | 0 |
| barium sulfate | 60 | 60 | 60 | 60 | 60 | 60 | 60 |
| Talc | 10 | 10 | 10 | 10 | 10 | 10 | 10 |
| BYK354 | 2 | 2 | 2 | 2 | 2 | 2 | 2 |
| BYK057 | 2 | 2 | 2 | 2 | 2 | 2 | 2 |
| Phthalocyanine Green | 1 | 1 | 1 | 1 | 1 | 1 | 1 |
| dicyandiamide | 1 | 1 | 1 | 1 | 1 | 1 | 1 |
| Irgacure 907 | 10 | 10 | 10 | 10 | 10 | 10 | 10 |
| TMPTA | 15 | 15 | 15 | 15 | 15 | 15 | 15 |
| EHPE3150 | 35 | 35 | 35 | 35 | 35 | 35 | 35 |

Note:

compound (d-1) (Actilane 170: molecular weight 5,000), compound (d-2) (Actilane167: molecular weight 900), EHPE3150 (alicyclic epoxy: epoxy equivalent 180, supplied by DAICEL CHEMICAL INDUSTRIES, LTD.), BYK354, BYK057 (antifoamer, surface smoothing agent: supplied by BYK Chemie), phthalocyanine green (supplied by Sanyo color works, Ltd.), Irgacure 907 (photopolymerization initiator, supplied by Ciba Geigy), TMPTA (trimethylolpropane triacrylate, supplied by NIPPON KAYAKU CO., LTD.).

TABLE 2

|  | Examples | | Comparative Examples | | | | |
| --- | --- | --- | --- | --- | --- | --- | --- |
|  | 1 | 2 | 1 | 2 | 3 | 4 | 5 |
| Adhesion | 100/100 | 100/100 | 100/100 | 100/100 | 100/100 | 100/100 | 100/100 |
| Flexibility (mm) | 4 | 5.2 | 1.1 | 6 | 1.6 | 1.2 | 3.5 |
| Heat durability against soldering | A | A | A | X | A | X | X |
| Tg (° C.) | 125 | 116 | 132 | 98 | 128 | 113 | 93 |
| Developability | A | A | A | X | A | A | A |
| Acid resistance | A | A | A | A | A | A | A |
| Anti-migration properties |  |  |  |  |  |  |  |
| Normal state | $6 \times 10^{14}$ | $5 \times 10^{14}$ | $6 \times 10^{14}$ | $4 \times 10^{14}$ | $6 \times 10^{14}$ | $4 \times 10^{14}$ | $3 \times 10^{14}$ |
| After PCT 400 hours (Ω) | $3 \times 10^{10}$ | $1 \times 10^{10}$ | $4 \times 10^{10}$ | $2 \times 10^{9}$ | $1 \times 10^{10}$ | $8 \times 10^{8}$ | $6 \times 10^{8}$ |
| Elongation (%) | 3.5 | 4.5 | 1.2 | 5.1 | 1.4 | 1.3 | 2.8 |
| Elastic modulus (kgf/mm$^2$) | 263 | 207 | 376 | 188 | 354 | 354 | 271 |
| Maximum stress (N/mm$^2$) | 54.8 | 56.7 | 55.2 | 52.6 | 54.3 | 47.6 | 46.7 |
| the number of Resist cracks | 3/100 | 0/100 | 93/100 | 0/100 | 82/100 | 98/100 | 41/100 |

EXAMPLES 3 AND 4 COMPARATIVE EXAMPLES 6 to 9

The synthesized main resin (i) and the main resin (ii), a compound (d) (Actilane170, supplied by Nihon SiberHegner K. K.) and a multistructure powder (e) having rubber elasticity in a core (Staphyloid AC3832, supplied by GANZ CHEMICAL CO., LTD.) were mixed in amounts shown in Table 3. The mixture was kneaded with a three-roll mill (supplied by Aimex) to obtain a photosensitive resin composition and a solution thereof.

The above solution (coating composition) was applied to a printed wiring board of which a copper circuit surface had been treated by a MEC CZ treatment (supplied by MEC. CO., LTD.). The applied composition was dried at 80° C. for 20 minutes to remove the solvent. A film was disposed thereon. The coating was exposed to ultraviolet light at 500 mJ/cm$^2$. Then, development was carried out with a 1 wt % sodium carbonate aqueous solution. The resultant coating was cured under heat at 150° C. for 1 hour. Table 4 shows the results of evaluation of characteristic properties. The characteristic properties were evaluated by the same methods as those adopted in Example 1. With regard to the thermal shock test in the crack resistance test, the cycles were changed from 300 cycles in Example 1 to 500 cycles.

TABLE 3

| | Examples | | Comparative Examples | | | | |
|---|---|---|---|---|---|---|---|
| | 1 | 2 | 1 | 2 | 3 | 4 | 5 |
| Resin (i) | 100 | 100 | 100 | 100 | 100 | 0 | 0 |
| Resin (ii) | 0 | 0 | 0 | 0 | 0 | 100 | 100 |
| Compound (d) | 15 | 30 | 0 | 60 | 0 | 0 | 15 |
| Powder (e) | 15 | 30 | 0 | 0 | 60 | 0 | 30 |
| barium sulfate | 50 | 50 | 50 | 50 | 50 | 50 | 50 |
| Talc | 10 | 10 | 10 | 10 | 10 | 10 | 10 |
| BYK354 | 2 | 2 | 2 | 2 | 2 | 2 | 2 |
| BYK057 | 2 | 2 | 2 | 2 | 2 | 2 | 2 |
| Phthalocyanine Green | 1 | 1 | 1 | 1 | 1 | 1 | 1 |
| dicyandiamide | 1 | 1 | 1 | 1 | 1 | 1 | 1 |
| Irgacure 907 | 5 | 5 | 5 | 5 | 5 | 5 | 5 |
| DETX | 0.5 | 0.5 | 0.5 | 0.5 | 0.5 | 0.5 | 0.5 |
| TMPTA | 15 | 15 | 15 | 15 | 15 | 15 | 15 |

TABLE 3-continued

| | Examples | | Comparative Examples | | | | |
|---|---|---|---|---|---|---|---|
| | 1 | 2 | 1 | 2 | 3 | 4 | 5 |
| Epikote 828 | 5 | 5 | 5 | 5 | 5 | 5 | 5 |
| EHPE3150 | 30 | 30 | 30 | 30 | 30 | 30 | 30 |

Note:
Epikote 828 (bisphenol A epoxy, supplied by Japan Epoxy Resins Co., Ltd), EHPE3150 (alicyclic epoxy: epoxy equivalent 180, supplied by DAICEL CHEMICAL INDUSTRIES, LTD.), BYK354, BYK057 (antifoamer, surface smoothing agent: supplied by BYK Chemie), phthalocyanine green (supplied by Sanyo color works, Ltd.), Irgacure 907 (photopolymerization initiator, supplied by Ciba Geigy), TMPTA (trimethylolpropane triacrylate, supplied by NIPPON KAYAKU CO., LTD.).

TABLE 4

| | Examples | | Comparative Examples | | | | |
|---|---|---|---|---|---|---|---|
| | 1 | 2 | 1 | 2 | 3 | 4 | 5 |
| Adhesion | 100/100 | 100/100 | 100/100 | 100/100 | 100/100 | 100/100 | 100/100 |
| Flexibility (mm) | 5.2 | 6.2 | 1.1 | 6 | 5 | 1.2 | 3.5 |
| Heat durability against soldering | A | A | A | X | X | X | X |
| Tg (° C.) | 121 | 108 | 131 | 98 | 101 | 111 | 90 |
| Developability | A | A | A | X | X | A | A |
| Acid resistance | A | A | A | A | A | A | A |
| Anti-migration properties | | | | | | | |
| Normal state | $5 \times 10^{14}$ | $4 \times 10^{14}$ | $5 \times 10^{14}$ | $4 \times 10^{14}$ | $4 \times 10^{14}$ | $4 \times 10^{14}$ | $3 \times 10^{14}$ |
| After PCT 400 hours (Ω) | $2 \times 10^{10}$ | $1 \times 10^{10}$ | $4 \times 10^{10}$ | $2 \times 10^{9}$ | $3 \times 10^{10}$ | $8 \times 10^{8}$ | $6 \times 10^{8}$ |
| Elongation (%) | 5.6 | 7.7 | 1.3 | 5.1 | 3.6 | 1.3 | 3.8 |
| Elastic modulus (kgf/mm$^2$) | 195 | 173 | 355 | 188 | 177 | 345 | 244 |
| Maximum stress (N/mm$^2$) | 50.8 | 44.7 | 54.2 | 52.6 | 42.6 | 47.8 | 46.7 |
| the number of Resist cracks | 6/100 | 0/100 | 92/100 | 10/100 | 28/100 | 98/100 | 33/100 |

What is claimed is:

1. A photosensitive resin composition (C) containing a photosensitive resin (B) which is a reaction product produced by modifying an epoxy acrylate (a) with a cyanate ester compound (b) to obtain a modification product (A) and reacting the modification product (A) with a polybasic acid anhydride (c), and a compound (d) of the formula,

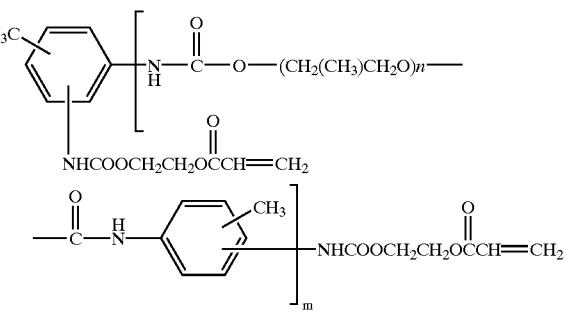

in which each of n and m is an integer of at least 1.

2. The photosensitive resin composition (C) according to claim 1, wherein the molecular weight of the compound (d) is 3,000 to 7,000.

3. The photosensitive resin composition (C) according to claim 1, wherein the composition (C) comprises 100 parts by weight of the photosensitive resin (B) and 1 to 50 parts by weight of the compound (d).

4. The photosensitive resin composition (C) according to claim 1, which further contains a multistructured core/shell powder (e) having rubber elasticity in a core.

5. The photosensitive resin composition (C) according to claim 4, wherein the composition (C) comprises 100 parts by weight of the photosensitive resin (B) and 5 to 30 parts by weight of the compound (d).

6. The photosensitive resin composition (C) according to claim 4, wherein the multistructured core/shell powder (e) is a powder obtained by coating the surface of globular acrylic rubber with a glassy polymer or an inorganic substance.

7. The photosensitive resin composition (C) according to claim 4, wherein the average particle diameter of the multistructured powder (e) is 0.06 to 20 $\mu$m.

8. The photosensitive resin composition (C) according to claim 6, wherein the glassy polymer forming the outer layer of the multistructured powder (e) is a polymer with a molecule having a carboxyl group.

9. The photosensitive resin composition (C) according to claim 4, wherein the composition (C) comprises 100 parts by weight of the photosensitive resin (B) and 5 to 30 parts by weight of the multistructured core/shell powder (e).

10. The photosensitive resin composition (C) according to claim 4, wherein the composition (C) comprises 100 parts by weight of the photosensitive resin (B), 5 to 30 parts by weight of the compound (d) and 5 to 30 parts by weight of the multistructured core/shell powder (e).

11. The cured product (D) of the photosensitive resin composition (C) recited in claim 1.

12. The cured product (D) of the photosensitive resin composition (C) recited in claim 4.

* * * * *